INTEGRATED SEMICONDUCTOR CIRCUIT DEVICE

Filed Feb. 12, 1959

INVENTOR
Richard F. Stewart
BY
Stevens, Davis, Miller & Mosher
ATTORNEYS

United States Patent Office 3,138,747

Patented June 23, 1964

3,138,747

INTEGRATED SEMICONDUCTOR CIRCUIT DEVICE

Richard F. Stewart, Dallas, Tex., assignor to Texas Instruments Incorporated, Dallas, Tex., a corporation of Delaware Filed Feb. 12, 1959, Ser. No. 792,840

6 Claims. (Cl. 317—235)

This invention relates to a multiple input semiconductor device with the circuit an integral part of the device. The device comprises a computer circuit commonly referred to as a "nor" circuit. A "nor" circuit performs the function of producing an output signal to indicate the fact that no signal is applied to any of its plurality of inputs.

This invention utilizes the fact that several base contacts of a semiconductor device may be relatively independent even though they are connected to the same base layer of a transistor structure. This phenomenon is the result of the very high sheet resistance which characterizes the very thin base regions made possible by vapor diffusion techniques of transistor fabrication. With such high sheet resistance, the transistor action of each base contact is confined to the region near such contact. The starting wafer from which the device is fabricated is selected to have a high resistivity. The load resistor then is realized from the resistance from the active region of the device through the wafer itself.

The invention improves over the prior art circuits in that the necessary circuit elements such as the load resistor may be made an integral part of the semiconductor element. One such semiconductor element according to the present invention replaces several transistors required in the circuits of the prior art performing the same function. The interconnecting circuit wiring is thereby eliminated or reduced. Also the gates of the "nor" circuit of the present invention provide amplification in addition to performing a logical function and the gates are well matched since they are basically one transistor.

The fact that the entire circuit is embodied in a single transistor element allows miniaturization of the circuit heretofore not realizable.

Other objects and advantages of the invention will become apparent as the following detailed description of the invention unfolds and when taken in conjunction with the following drawings wherein.

Figures 1, 2, 3, 4:
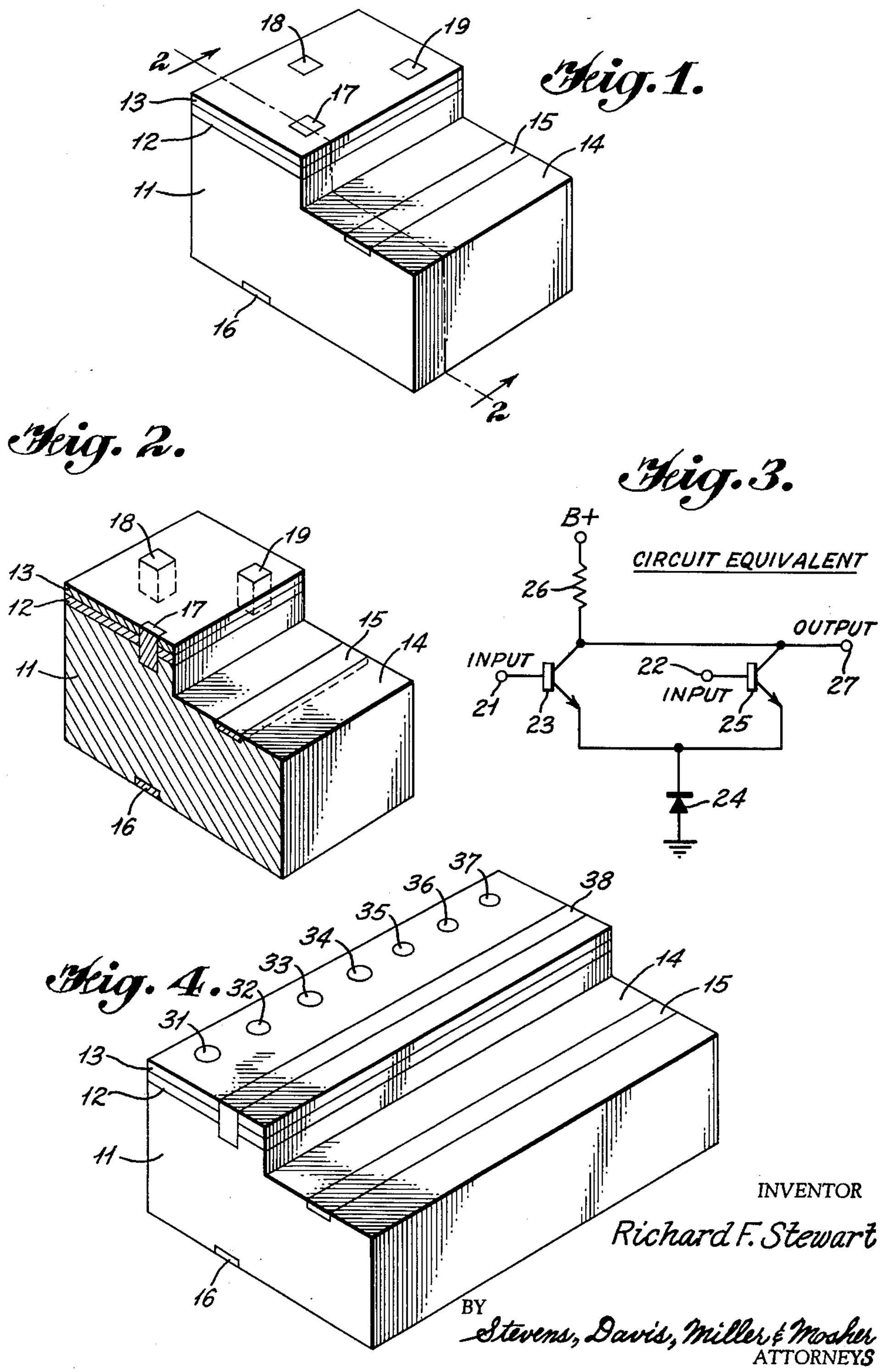
FIGURE 1 shows a perspective view of one embodiment of the invention.
FIGURE 2 illustrates a cross section taken through the embodiment shown in FIGURE 1.
FIGURE 3 illustrates the schematic diagram of the equivalent circuit provided by the embodiment shown in FIGURES 1 and 2.
FIGURE 4 shows a modification of the embodiment shown in FIGURES 1 and 2.

The transistor device, shown in FIGURES 1 and 2, comprises a block of semiconductor material. This block of semiconductor material is divided into three layers, a lower thick collector layer 11, a base layer 12 and an emitter layer 13. The base layer 12 is made extremely thin such as can be obtained by vapor diffusion techniques and as such the base layer has a very high sheet resistance. A section of semiconductor material is formed from the block of semiconductor material passing through both the emitter and base layers to shape the block of semiconductor material in the form of a step and providing an additional exterior surface 14 for the collector layer 11. A conductor makes ohmic contact with the collector layer 11 on the surface 14 to form a contact 15. A second conductor makes ohmic contact with the bottom surface of the collector layer 11 to form a second contact 16. Additional conductors pass through the emitter layer 13 to make ohmic contact with the base layer 12 to form contacts 17, 18 and 19. The three contacts 17, 18 and 19 make rectifying contact with the emitter layer 13. Because the base layer is so thin, the contacts 17, 18 and 19 may pass all the way through the base layer 12 into the collector layer 11. The contacts 17, 18 and 19 make rectifying contact with the collector layer 11.

The dimensions used in the illustrations of FIGURES 1 and 2 are, of course, not accurate, as the collector layer 11 will be much thicker than the base layer 12. Also the contact 15 will be much nearer to the base layer than the contact 16 so that the conductive path through the collector layer 11 from the active area of the transistor device to the contact 15 is much shorter than the conductive path from the active area to the contact 16. As a result, there is a considerably greater resistance between the contact 16 and the active region than between the contact 15 and the active region. The former resistance will function as a load resistor for the device. The collector layer 11 is made from a wafer having a high resistivity so that the conductive path between the active area and the contact 16 will provide the desired resistance for the load resistor.

The transistor device may be either PNP or NPN. If the device is NPN, it will provide the equivalent of the circuit shown in FIGURE 3 with no additional circuitry other than the applied bias voltage. The contact 15 becomes the output 27. The B plus is applied to the contact 16; and one of the contacts 17, 18 and 19, preferably the contact 18, is grounded to become the emitter contact. The input signals may be applied to the conductors 17 and 19 and correspond to the inputs 21 and 22 of the circuit shown in FIGURE 3. Because the base layer 12 has such a high sheet resistance, the device will function as two separate transistors, which are designated as 23 and 25 in the equivalent circuit of FIGURE 3. The rectifying contact between the conductor 18 and the emitter layer 13 forms the rectifier or diode 24 of the equivalent circuit and the large resistance between the active area of the device and the contact 16 forms the load resistor 26.

When a signal represented by a positive voltage is applied to the input 21 of the circuit shown in FIGURE 3, the transistor 23 will conduct. The diode 24 will break down and operate in its Zener region. Thus the output voltage produced at output 27 will be relatively low. Likewise when a signal represented by a positive voltage is applied to input 22, the transistor 25 will conduct with the diode 24 breaking down and a relatively low voltage will be produced at output 27. Whereas if neither input 21 or 22 has such a signal applied thereto, neither of the transistors 23 or 25 will conduct and the voltage produced at output 27 will be relatively high. This relatively high voltage will represent the presence of an output signal and indicate that no input signal as represented by a positive voltage is applied to either of the inputs 21 or 22. Thus the circuit is a "nor" circuit. Since the circuit of FIGURE 3 is the equivalent of the device shown in FIGURES 1 and 2, this device constitutes a "nor" circuit when properly biased.

The modification shown in FIGURE 4, like the device of FIGURES 1 and 2, comprises a block of semiconductor material having a thick, high resistivity collector layer 11, a very thin base layer 12 having a high sheet resistance, and an emitter layer 13. Also like the modifications shown in FIGURES 1 and 2 the modification of FIGURE 4 has a rectangular section cut out to expose an additional surface 14 on which a conductor makes ohmic contact with the collector layer 11 to form a contact 15. Also a conductor makes ohmic contact with the bottom surface of the collector layer 11 to form contact 16. Seven conductors pass through the emitter layer 13 making rectifying contact therewith to make ohmic contact with the base layer 12 to form contacts 31 through 37. An additional conductor forms contact 38 which runs the entire length of the block of semiconductor material and passes through the emitter layer 13 making rectifying contact therewith to make ohmic contact with the base layer 12. Because the base layer 12 is so thin, it is practical for the contacts 31 through 38 to pass entirely through the base layer 12 and into the collector layer 11. The contacts 31 through 38 make rectifying contact with the collector layer 11.

In this modification, like the modification of FIGURES 1 and 2, the conductive path from the active area to the contact 16 is considerably greater than that from the active area to contact 15. The modification shown in FIGURE 4 will thus form a "nor" circuit just as the modification shown in FIGURES 1 and 2, except that instead of just two transistors in parallel there will be seven transistors in parallel with each of the contacts 31 through 37 forming inputs for the seven transistors and the contact 38 forming the emitter contact through a rectifier. To bias the device, contact 38 may be grounded and the contact 16 may have the B plus applied thereto. The contact 15 will be the output conductor, and the circuit will function to produce an output signal at the contact 15 only when no input signal is applied to any of the contacts 31 through 37.

In place of using rectifying contacts 17, 18 and 19 with emitter layer 13, it will be appreciated that contacts functioning as emitter contacts can make ohmic contact with layer 13. The advantage of using rectifying contacts is that since only one type of contact is used there is uniformity of contact processing.

Also it is possible to use multiple emitter contacts in place of a strip contact 38 and to tie the several contacts together. It would even be conceivable to use a combination of these contacts.

Whereas the invention has been shown as a block having contacts arranged in a group of three or in a row with respect to a strip, it will of course be understood that any geometrical, random or statistical grouping, arrangement or pattern is within the purview of the invention.

The number of input conductors can be increased indefinitely limited only by the size of the wafer. The contact 15 need not be formed on the cut away portion but may be formed on the side of the semiconductor wafer. It is only necessary that the contact 15 be near the base layer so that the resistance path from the base layer to the contact 15 is short to form a low resistance relative to the resistance path between the base layer 12 and the contact 16. These and other modifications are considered to come within the scope and spirit of the present invention which is limited only as defined in the appended claims.

What is claimed is:

1. A semiconductor device comprising an emitter layer, a base layer, and a collector layer, a plurality of base layer contacts passing through said emitter layer, said base layer having sufficient sheet resistance to make the operation of each of said base contacts substantially independent of each other, a portion of said emitter and base layers cut away to expose an additional surface on said collector layer, a first collector contact on said additional surface, a second collector contact on the surface opposite said additional surface, said collector layer having a shape that the conductive path from the boundary between said base layer and said collector layer through said collector layer to said second collector contact is substantially greater than the conductive path from said boundary through said collector layer to said first collector contact.

2. A semiconductor device comprising an emitter layer, a base layer, and a collector layer, a plurality of contacts each passing through said emitter layer making rectifying contact therewith, said base layer having sufficient sheet resistance to make the operation of each of said contacts when biased as a base contact substantially independent of each other, any one of said contacts functioning as the emitter contact when biased properly, a portion of said emitter and base layers cut away to expose an additional surface on said collector layer, a first collector contact on said additional surface, and a second collector contact on the surface opposite said additional surface.

3. An integrated circuit device comprising:

(*a*) a thin wafer of monocrystalline extrinsic semiconductor material, (*b*) first crystal means of one conductivity-type included in said wafer providing collectors for a plurality of transistors, (*c*) second crystal means of the opposite conductivity-type included in said wafer adjacent a major face thereof, the second crystal means being very thin relative to the lateral dimensions thereof and relative to the thickness of the wafer, the second crystal means providing bases for a plurality of transistors, the lateral area occupied by the second crystal means adjacent said major face being much less than the total surface area of said major face, (*d*) third crystal means of said one conductivity-type included in said wafer adjacent said major face, the third crystal means being very thin relative to the lateral dimensions thereof and relative to the thickness of the wafer, the third crystal means providing emitters for a plurality of transistors, the surface area occupied by the third crystal means on said major face being much less than the total surface area of said major face, (*e*) a plurality of transistors provided by the first, second and third crystal means, each transistor being defined in a separate small portion of the wafer adjacent said major face, the small portions being laterally spaced from one another on said major face, diffusion of minority carriers being effective in each small portion through only a part of the second crystal means to only a part of the first crystal means, the total lateral area of the small portions adjacent said major face being much less than the total surface area of said major face, and less than the lateral area of the second crystal means adjacent said major face, (*f*) first contact means engaging said small portions of the wafer on said one major face, said first contact means being connected to said third crystal means and effective in operation to provide substantially ohmic connections to the emitters of the plurality of transistors, (*g*) a plurality of second contacts to the wafer on said one major face ohmically engaging the second crystal means at said small portions so that the second contacts will provide separate inputs to the bases of the transistors, (*h*) conductive means on said one major face ohmically engaging said first crystal means at positions closely adjacent said small portions of the wafer to provide collector contacts for the plurality of transistors, (*i*) a resistor region defined within the wafer effective to provide a common collector load resistor for at least two of the plurality of transistors, the resistor region being ohmically engaged at one end by said conductive means on said one major face of the wafer, the resistor region being electrically isolated from the second and third crystal means by P–N junction means, (*j*) third contact means engaging the wafer on a major face thereof ohmically contacting the other end of the resistor region, the third contact means being spaced from the parts of the first crystal means which function as the collectors of the transistors by distances much greater than the spacing between such parts and the positions where the conductive means engage the first crystal means, (k) and means for applying operating bias voltage to the first and third contact means.

4. A semiconductor integrated circuit device comprising:

(a) a wafer of monocrystalline semiconductor material;

(b) a plurality of junction transistors defined in the wafer adjacent one major face thereof by thin layers of semiconductor material of alternate conductivity types closely adjacent said one major face, each transistor having a collector region, a base region and an emitter region separated from one another by a collector-base junction and an emitter-base junction, the transistors being laterally spaced along said one major face;

(c) a semiconductor resistor region provided within the wafer;

(d) a plurality of electrically conductive means engaging the surface of the wafer;

(e) a first of said conductive means making non-rectifying electrical connection on said one major face to the collector regions of each of the transistors and to one end of the resistor region;

(f) a second of said conductive means making non-rectifying electrical connection to the other end of the resistor region, the resistance through the resistor region from the first to the second conductive means being much greater than the resistance between the collector-base junction of each transistor and the first conductive means;

(g) a third of said conductive means making electrical connection on said one major face to the emitter regions of each of the transistors;

(h) means for supplying operating bias potential across said second and third conductive means to reverse bias the collector-base junction of each of the transistors, the resistor region thereby providing a collector load resistor;

(i) and a plurality of base contacts making separate electrical connection on said one major face to the base regions of each of the transistors so that the emitter-base junction of each of the transistors may be separately forward biased by potentials applied to such base contacts.

5. An integrated circuit comprising a wafer of single crystal semiconductor material with a plurality of junction transistors provided within the wafer adjacent one face thereof by regions of opposite conductivity-types overlying one another, each transistor including a collector, a base, and an emitter; a portion of the wafer providing the electrical properties of a resistor; conductive means secured to said one face making low resistance ohmic contact to one end of said resistor portion and to the collectors of the plurality of transistors so that the collectors are effectively connected together; separate electrical connections including contacts on said one face to the bases of the transistors; conductive means engaging said one face contacting the emitters of the transistors; and an electrical connection to the other end of said resistor portion.

6. An integrated circuit comprising a wafer of single crystal semiconductor material with regions of alternate conductivity-type defined in the wafer overlying one another adjacent one face thereof to provide a pair of transistors with each transistor including a collector, a base, and an emitter, a semiconductor resistor region provided in the wafer, conductive means engaging said one face of the wafer contacting one end of the resistor region and also contacting the collectors of the pair of transistors so that the collectors are effectively connected together, a pair of base contacts on said one face with each separately engaging the base of a different one of the transistors, conductive means engaging said one face contacting the emitters of the transistors, and an electrical connection to the other end of the resistor region.

References Cited in the file of this patent

UNITED STATES PATENTS

| | | |
|---|---|---|
| 2,831,787 | Emeis | Apr. 22, 1958 |
| 2,845,372 | Jones et al. | July 29, 1958 |
| 2,866,140 | Jones et al. | Dec. 23, 1958 |
| 2,870,050 | Mueller et al. | Jan. 20, 1959 |
| 2,889,469 | Green | June 2, 1959 |
| 3,007,091 | Fuller | Oct. 31, 1961 |